(12) United States Patent
Chen et al.

(10) Patent No.: US 12,587,044 B2
(45) Date of Patent: Mar. 24, 2026

(54) WIRELESS CHARGING DEVICE

(71) Applicant: Anker Innovations Technology Co., Ltd., Changsha (CN)

(72) Inventors: Wei Chen, Shenzhen (CN); Zhifeng Zhong, Shenzhen (CN); Kang Xiong, Shenzhen (CN); Yue Zhao, Shenzhen (CN)

(73) Assignee: Anker Innovations Technology Co., Ltd., Changsha (CN)

( * ) Notice: Subject to any disclaimer, the term of this patent is extended or adjusted under 35 U.S.C. 154(b) by 0 days.

(21) Appl. No.: 18/778,152

(22) Filed: Jul. 19, 2024

(65) Prior Publication Data

US 2025/0337285 A1     Oct. 30, 2025

(30) Foreign Application Priority Data

Apr. 30, 2024 (CN) .......................... 202410545019.8
Apr. 30, 2024 (CN) .......................... 202420945180.X

(51) Int. Cl.
| | |
|---|---|
| H02J 7/00 | (2006.01) |
| H02J 7/14 | (2006.01) |
| H02J 50/10 | (2016.01) |
| H02J 50/40 | (2016.01) |
| H02J 50/90 | (2016.01) |
| H05K 7/20 | (2006.01) |

(52) U.S. Cl.
CPC .............. H02J 50/90 (2016.02); H02J 50/10 (2016.02); H02J 50/40 (2016.02); H05K 7/209 (2013.01)

(58) Field of Classification Search
CPC .......... H02J 7/00; H02J 7/0044; H02J 7/0042; H02J 50/10; H02J 50/40

USPC .......................................................... 320/132
See application file for complete search history.

(56) References Cited

U.S. PATENT DOCUMENTS

| | | | | |
|---|---|---|---|---|
| 10,739,822 B2 * | 8/2020 | Choi | ......................... | H04M 1/04 |
| D934,794 S * | 11/2021 | Brisebras | ..................... | D13/108 |
| D951,864 S * | 5/2022 | Chen | ............................ | D13/108 |
| D960,094 S * | 8/2022 | Jiang | ............................ | D13/108 |
| D960,095 S * | 8/2022 | Chen | ............................ | D13/108 |

(Continued)

FOREIGN PATENT DOCUMENTS

| | | |
|---|---|---|
| CN | 207504934 U | 6/2018 |
| CN | 214617469 U | 11/2021 |

(Continued)

OTHER PUBLICATIONS

Oct. 3, 2024—(JP) Office Action of 2004-116859.

(Continued)

*Primary Examiner* — Alexis B Pacheco
(74) *Attorney, Agent, or Firm* — Banner & Witcoff, Ltd.

(57) ABSTRACT

A wireless charging apparatus may comprise a first shell, a second shell, a magnet, and a wireless charging assembly. The second shell may be rotatably connected to the first shell, and the second shell may be rotatable in a circumferential direction of the first shell. The wireless charging assembly may be connected to the second shell or the first shell to charge an electronic device. The magnet may be connected to the second shell or the first shell, a charging region corresponding to the wireless charging assembly is formed on the second shell, and the magnet is used for holding a device to the charging region through magnetic force.

19 Claims, 11 Drawing Sheets

(56) References Cited

U.S. PATENT DOCUMENTS

| | | | | |
|---|---|---|---|---|
| D967,020 | S | * | 10/2022 | Wu ............................... D13/108 |
| D971,139 | S | * | 11/2022 | Lin ............................... D13/108 |
| D976,825 | S | * | 1/2023 | Peng ............................ D13/108 |
| D984,375 | S | * | 4/2023 | Lin ............................... D13/108 |
| D1,000,379 | S | * | 10/2023 | Liao ............................. D13/108 |
| D1,008,176 | S | * | 12/2023 | Saangloef .................... D13/108 |
| D1,011,286 | S | * | 1/2024 | Nie .............................. D13/108 |
| D1,013,629 | S | * | 2/2024 | Wang ........................... D13/108 |
| 2010/0081473 | A1 | * | 4/2010 | Chatterjee .............. H02J 50/10 |
| | | | | 455/575.1 |
| 2010/0146308 | A1 | * | 6/2010 | Gioscia ................... H02J 50/90 |
| | | | | 307/104 |
| 2012/0273630 | A1 | * | 11/2012 | Gillespie-Brown ......................... |
| | | | | F16M 11/105 |
| | | | | 248/122.1 |
| 2013/0078855 | A1 | * | 3/2013 | Hornick ............... F16M 11/041 |
| | | | | 439/571 |
| 2015/0002088 | A1 | * | 1/2015 | D'Agostino ............ H02J 50/10 |
| | | | | 320/108 |
| 2015/0162767 | A1 | * | 6/2015 | Oh ........................... H02J 50/70 |
| | | | | 320/108 |
| 2017/0338676 | A1 | * | 11/2017 | Yan ............................ H02J 7/14 |
| 2018/0229859 | A1 | * | 8/2018 | Evans ........................ B64F 1/36 |
| 2020/0076220 | A1 | * | 3/2020 | Chow ..................... H02J 50/90 |
| 2020/0191345 | A1 | * | 6/2020 | Chien ..................... F21V 21/22 |
| 2021/0281090 | A1 | * | 9/2021 | Stevens ............... F16M 11/041 |
| 2022/0113762 | A1 | * | 4/2022 | Campbell .............. F16M 11/22 |
| 2022/0190642 | A1 | | 6/2022 | Huang et al. |
| 2023/0146663 | A1 | * | 5/2023 | Zhao ..................... H02J 7/0042 |
| | | | | 320/107 |
| 2023/0291233 | A1 | * | 9/2023 | Chang ................ F16M 11/2014 |

FOREIGN PATENT DOCUMENTS

| | | | | |
|---|---|---|---|---|
| CN | 214799051 | U | | 11/2021 |
| CN | 214900259 | U | | 11/2021 |
| CN | 215071817 | U | * | 12/2021 |
| CN | 215185930 | U | | 12/2021 |
| CN | 216356070 | U | | 4/2022 |
| CN | 216530637 | U | | 5/2022 |
| CN | 217282381 | U | | 8/2022 |
| CN | 217882880 | U | | 11/2022 |
| CN | 116345729 | A | | 6/2023 |
| CN | 219554634 | U | | 8/2023 |
| CN | 219697367 | U | | 9/2023 |
| CN | 220043071 | U | | 11/2023 |
| CN | 220139263 | U | | 12/2023 |
| KR | 20200018186 | A | | 2/2020 |

OTHER PUBLICATIONS

Apr. 30, 2024—(CN)—Evaluation report on Chinese patent ZL202420945180X.
Dec. 20, 2024 (EP)—Search Report of EP24189516.
Dec. 11, 2024 (JP)—2nd Office Action JP2024-116859.
Jan. 29, 2020 (JP)—Notice of Allowance of Application 2024-116859.

* cited by examiner

WIRELESS CHARGING DEVICE

CROSS-REFERENCE TO RELATED APPLICATIONS

This application claims priority to Chinese Application No. 202410545019.8, filed on Apr. 30, 2024, and Chinese Application No. 202420945180.X, filed on Apr. 30, 2024. The entire disclosures of each of the above applications are incorporated herein by reference.

TECHNICAL FIELD

The present application relates to the technical field of wireless charging, in particular to a wireless charging device (e.g., apparatus).

BACKGROUND

In daily life, people often need to use various electronic products, and many electronic products require frequent charging. Conventional wired charging operations are relatively cumbersome. With the development of technology, wireless chargers that facilitate user's charging operations have emerged. The wireless chargers can be used for charging electronic devices such as mobile phones, headphones, and watches.

The wireless charger may be equipped with a structure for limiting a to-be-charged device to maintain its stability in the charging process. At present, when the wireless charger limits the to-be-charged device, it is inconvenient to adjust the posture of the to-be-charged device, which brings an adverse impact on user experience.

SUMMARY

The main technical problem to be solved by the present application is to provide a wireless charging apparatus, which can improve the smoothness of rotation of a to-be-charged device and easily adjust the posture (e.g., position, location) of the to-be-charged device.

To solve the above technical problem, the technical solution adopted in the present application is to provide a wireless charging apparatus. The wireless charging apparatus includes a wireless charging module and a support mechanism. The wireless charging module includes a first shell, a second shell, a magnetic attraction assembly (e.g., one or more magnets), and a wireless charging assembly. The second shell is rotatably connected to the first shell, and the second shell is rotatable in a circumferential direction of the first shell. The wireless charging assembly is connected to the second shell or the first shell to charge a to-be-charged device. The magnetic attraction assembly is connected to the second shell or the first shell, a charging region corresponding to the wireless charging assembly is formed on the second shell, and the magnetic attraction assembly is used for limiting the to-be-charged device to the charging region through magnetic force. The support mechanism is connected to the first shell to support the wireless charging module.

Beneficial effects of the present application are as follows: Different from the related techniques, the wireless charging module includes a first shell, a second shell, a magnetic attraction assembly, and a wireless charging assembly, where the second shell is rotatably connected to the first shell, the second shell is rotatable in a circumferential direction of the first shell, the wireless charging assembly is connected to the second shell or the first shell to charge a to-be-charged device, the magnetic attraction assembly is connected to the second shell or the first shell, a charging region corresponding to the wireless charging assembly is formed on the second shell, the magnetic attraction assembly is used for limiting the to-be-charged device to the charging region through magnetic force, and the support mechanism is connected to the first shell to support the wireless charging module. When a user adjusts the posture of the to-be-charged device in the circumferential direction of the first shell, the second shell can rotate synchronously with the to-be-charged device, so that there may be no sliding friction between the second shell and the to-be-charged device, or the sliding friction between the second shell and the to-be-charged device can be reduced, which is conducive to improving the smoothness of rotation of the to-be-charged device, facilitating the adjustment on the posture of the to-be-charged device, and promoting user's hand feel. For example, the to-be-charged device may be a mobile phone. By rotating the to-be-charged device relative to the first shell, the posture of the phone can be adjusted, and the phone can switch between horizontal and vertical screens, or the tilting phone can be straightened.

DETAILED DESCRIPTION

The following clearly and completely describes the technical solutions in the examples of the present application in conjunction with the accompanying drawings therein. Apparently, the described examples are only some of the examples of the present application, not all of them. Based on the examples of the present application, all other examples obtained by those skilled in the art without creative work shall fall within the scope of protection of the present application.

After long-term research, the inventor found, with the development of technology, wireless chargers that facilitate user's charging operations have emerged. The wireless chargers can be used for charging electronic devices such as mobile phones, headphones, and watches. The wireless charger may be equipped with a structure for limiting a to-be-charged device (e.g., an electronic device) to maintain its stability in the charging process. At present, when a wireless charger limits the to-be-charged device, it is inconvenient to adjust the posture of the to-be-charged device, which brings an adverse impact on user experience. To solve the technical problem, the present application provides the following examples.

Figure 1:
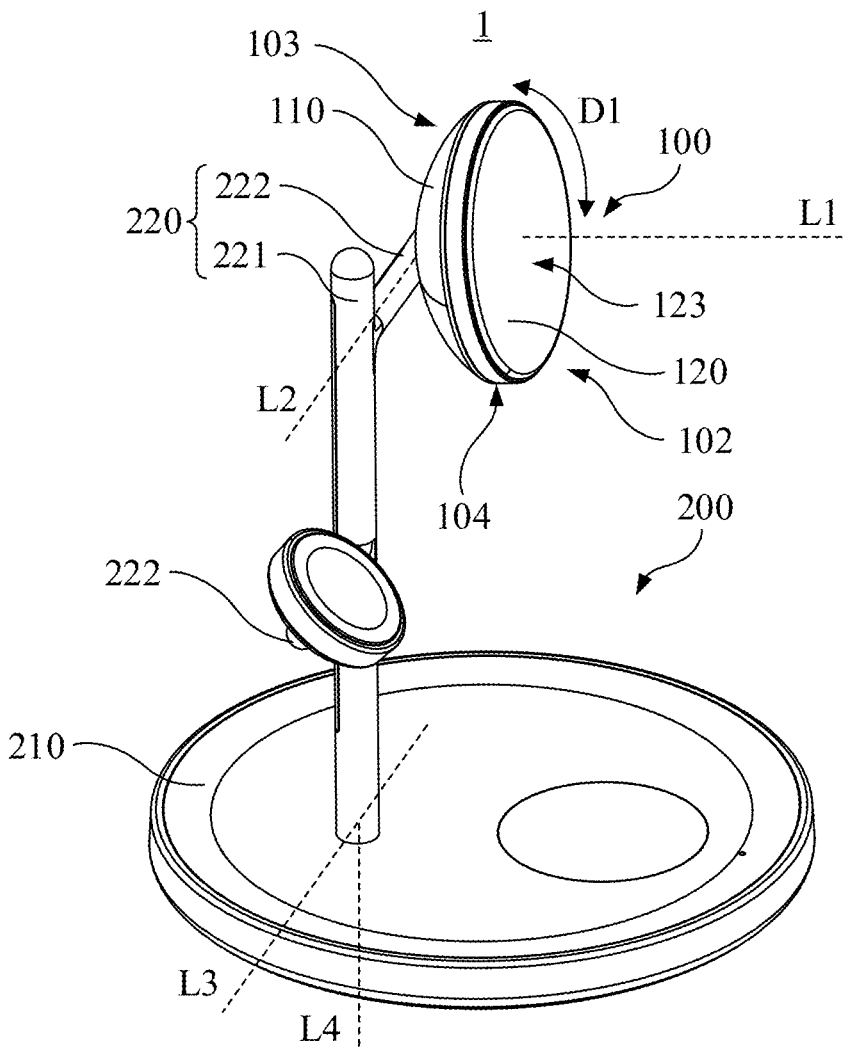
FIG. 1 is a schematic diagram of a three-dimensional structure of an example of a wireless charging apparatus in the present application.
Figure 2:
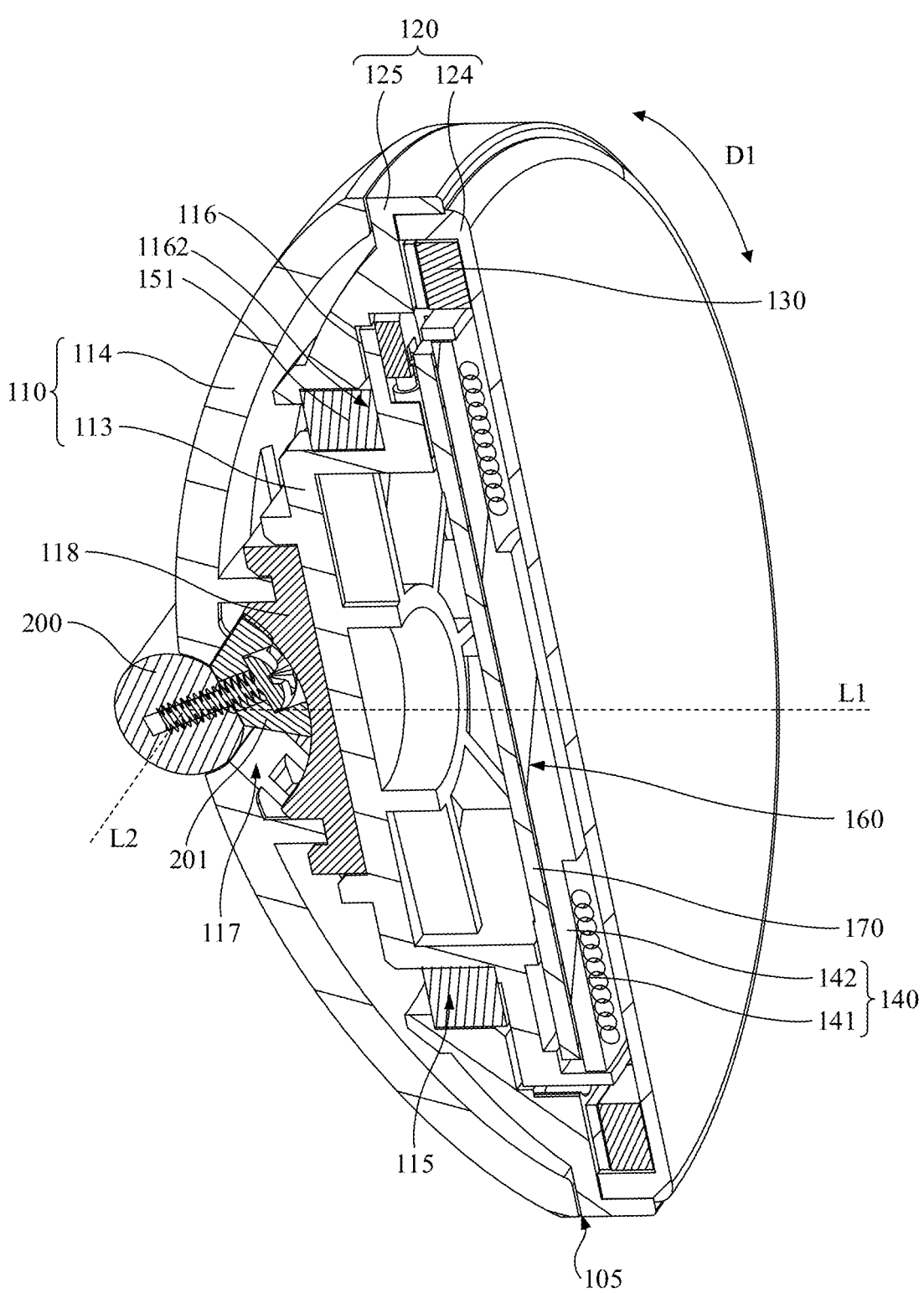
FIG. 2 is a schematic diagram of a partial cross-sectional structure of an example of the wireless charging apparatus in the present application.
Figure 3:
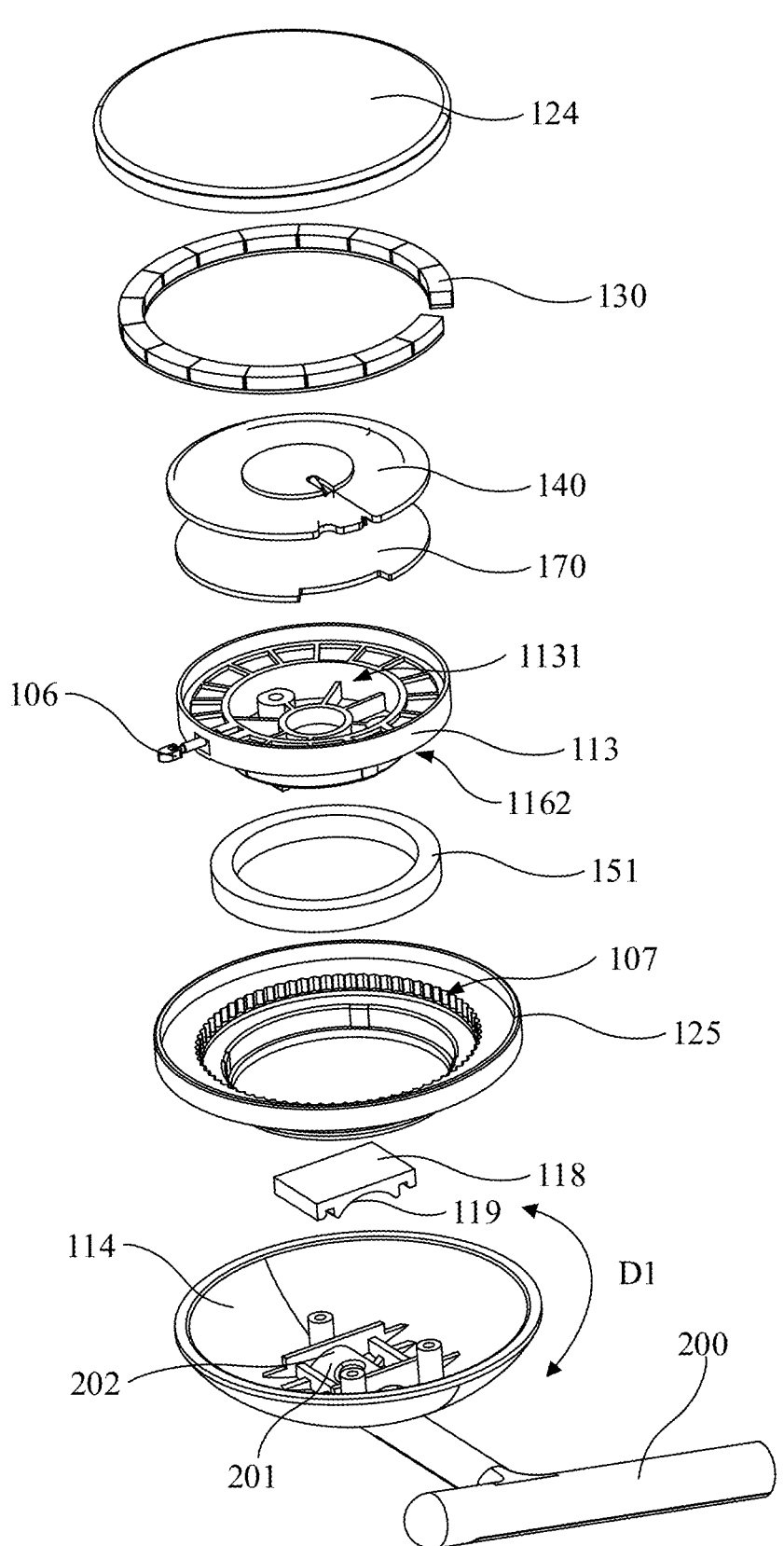
FIG. 3 is a schematic diagram of a partial disassembly structure of an example of the wireless charging apparatus in the present application.

As shown in FIG. 1 to FIG. 3, a wireless charging apparatus 1 described in an example of the present application includes a wireless charging module 100 and a support mechanism 200. The wireless charging module 100 includes a first shell 110 (e.g., a first housing), a second shell 120 (e.g., a second housing, a device mounting surface), a magnetic attraction assembly 130, and a wireless charging assembly 140. The second shell 120 is rotatably connected to the first shell 110, and the second shell 120 is rotatable in a circumferential direction D1 of the first shell 110. The wireless charging assembly 140 is connected to the second shell 120 or the first shell 110 to charge a to-be-charged device (e.g., in the second shell 120). The magnetic attraction assembly 130 is connected to the second shell 120 or the first shell 110 (e.g., in the second shell 120), a charging region 123 corresponding to the wireless charging assembly 140 is formed on the second shell 120, and the magnetic attraction assembly 130 is used for (e.g., configured to) limiting (e.g., holding, attaching) the to-be-charged device to the charging region 123 through magnetic force. The support mechanism 200 is connected to the first shell 110 to support the wireless charging module 100.

By using the support mechanism 200 to support the wireless charging module 100, it is beneficial for the wireless charging module 100 to maintain its posture stability while bearing the to-be-charged device. Further, the support mechanism 200 can be used for elevating the wireless charging module 100, so that the wireless charging module 100 and the to-be-charged device can be spaced apart from a placement surface of the wireless charging apparatus 1.

The posture of the to-be-charged device sometimes needs to be adjusted during charging. For example, the to-be-charged device may be a mobile phone, and the posture of the phone can be adjusted by rotating the to-be-charged device relative to the first shell 110, so that the phone can switch between horizontal and vertical screens. For another example, the to-be-charged device may be a mobile phone, and the tilting phone can be straightened by rotating the to-be-charged device relative to the first shell 110.

By rotatably connecting the second shell 120 to the first shell 110, when a user adjusts the posture of the to-be-charged device in the circumferential direction D1 of the first shell 110, the second shell 120 and the to-be-charged device can rotate synchronously, so that there is no sliding friction between the second shell 120 and the to-be-charged device, or the sliding friction between the second shell 120 and the to-be-charged device can be reduced, which can improve the smoothness of rotation of the to-be-charged device, facilitating the adjustment on the posture of the to-be-charged device, and improving user's hand feel.

The support mechanism 200 can be electrically connected to the first shell 110, so that the wireless charging module 100 can be connected to a power source through the support mechanism 200. In some examples, a wire 230 can extend from the support mechanism 200 through the first shell 110 into the wireless charging module 100 and is electrically connected to the wireless charging assembly 140. When the user adjusts the posture of the to-be-charged device in the circumferential direction D1 of the first shell 110, the first shell 110 may not rotate with the to-be-charged device, thereby reducing the twisting, stretching, squeezing, and other effects on the wire 230 and reducing the risk of damage to the wire 230.

As shown in FIG. 1 to FIG. 3, the wireless charging assembly 140 may include a transmitting coil 141 and a magnetic separator 142. The transmitting coil 141 is used for charging the to-be-charged device, and the magnetic separator 142 is used for reducing electromagnetic interference to improve charging efficiency. Further, the wireless charging apparatus 1 includes a circuit board assembly 170. In some examples, the wireless charging assembly 140 can be disposed on the circuit board assembly 170 and electrically connected to the circuit board assembly 170, the circuit board assembly 170 can be used for controlling the process of charging the to-be-charged device by the wireless charging assembly 140, and the circuit board assembly 170 can also be used for assisting the transmitting coil 141 in heat dissipation to reduce the temperature of the transmitting coil 141. The circuit board assembly 170 may include at least one printed circuit board (PCB).

Further, a thermal adhesive may be further provided on the circuit board assembly 170 to promote the heat dissipation of the wireless charging assembly 140.

The circuit board assembly 170 may be disposed inside the support mechanism 200. For example, the support mechanism 200 may include a base 210 and a support rod 220 connected to each other, the first shell 110 is connected to the support rod 220, and the support rod 220 is supported on the base 210 to support the wireless charging module 100. The base 210 may support the wireless charging module 100 through the support rod 220. The wire 230 can extend from the base 210 through the support rod 220 into the wireless charging module 100. In some examples, the circuit board assembly 170 can be disposed inside the base 210, so that the wireless charging module 100 is thinner and the heat generation of the wireless charging module 100 can be reduced. In other examples, the circuit board assembly 170 includes a heat dissipation circuit board (not shown) and a control circuit board (not shown), the control circuit board is disposed inside the base 210 to control the process of charging the to-be-charged device by the wireless charging assembly 140, the heat dissipation circuit board is disposed inside the wireless charging module 100, the wireless charging assembly 140 is disposed on the heat dissipation circuit board and electrically connected to the heat dissipation circuit board, and the heat dissipation circuit board is used for assisting the transmitting coil 141 in heat dissipation to improve the working state of the wireless charging module 100.

The base 210 may be rotatably connected to the support rod 220. The support rod 220 rotates relative to the base 210 to drive the first shell 110 to approach or move away from the base 210. In this way, the support mechanism 200 can be folded for easy storage of the wireless charging apparatus 1.

The support rod 220 may be retractable or foldable, and the support rod 220 can adjust its height through extension and retraction or folding movement for easy storage. For example, the support rod 220 may include a first sub-rod body and a second sub-rod body that are rotatably connected. The first sub-rod body and the second sub-rod body may rotate relatively to achieve folding or extension of the support rod 220.

In some examples, the support mechanism 200 is detachably connected to the wireless charging module 100, and the wireless charging module 100 can be disassembled to facilitate charging of the to-be-charged device. Specifically, the support mechanism 200 may be detachably connected to the first shell 110.

For example, the support mechanism 200 is detachably connected to the wireless charging module 100 by a buckle or magnetic attraction. Alternatively, the support mechanism 200 is provided with (e.g., comprises) a clamp for clamping the wireless charging module 100.

In some examples, a battery module (e.g., one or more batteries) (not shown) is provided inside the wireless charging module 100, and the battery module can supply power to the to-be-charged device.

In some examples, the wireless charging module 100 is provided with a charging interface (not shown), which can be connected to an external power source through a charging cable to supply power to the to-be-charged device.

Further, the charging interface is disposed on the first shell 110. When the wireless charging module 100 charges the to-be-charged device, the position of the charging cable can be easily adjusted by rotating the first shell 110 relative to the second shell 120, so that the wireless charging module 100 charges the to-be-charged device in more scenarios.

The wireless charging module 100 may have a front surface 102, a back surface 103, and a peripheral side surface 104 connected between the front surface 102 and the back surface 103. In some examples, the charging interface is disposed on the peripheral side surface 104 of the wireless charging module 100. In another some examples, the charging interface is disposed on the back surface 103 of the wireless charging module 100.

In some examples, the support mechanism 200 is provided with a power supply interface (not shown) that matches the charging interface. When the support mechanism 200 and the wireless charging module 100 are connected, the power supply interface is plugged into the charging interface to connect the support mechanism 200 and the wireless charging module 100, and to connect the wireless charging assembly 140 to the power source through the support mechanism 200. In other examples, a first electrical contact (not shown) is provided on the first shell 110, and the wireless charging assembly 140 is electrically connected to the first electrical contact; the support mechanism 200 is provided with a second electrical contact (not shown) corresponding to the first electrical contact; and when the support mechanism 200 and the first shell 110 are connected, the first electrical contact abuts against the second electrical contact, so that the wireless charging assembly 140 is connected to the power source through the support mechanism 200.

As shown in FIG. 1 to FIG. 3, the support rod 220 may include a main rod 221 and branch rods 222, the main rod 221 is connected to the base 210, and the branch rods 222 are connected between the first shell 110 and the main rod 221. Further, the quantity of the branch rods 222 may be two or more, and different branch rods 222 can support different wireless chargers, so that the wireless charging apparatus 1 can charge different to-be-charged devices (including a mobile phone, a watch, a headphone, etc.). In some examples, the wireless chargers supported by different branch rods 222 may include the wireless charging module 100 and other types of wireless chargers. In other examples, the wireless chargers supported by different branch rods 222 are the same or different wireless charging modules 100. For example, a wireless charger for charging a watch or a headphone can be disposed on the base. For example, the wireless charger supported by the branch rod 222 can charge a watch or a headphone.

In some examples, the support rod 220 may be an independent rod, and may be a straight rod, a bent rod, or the like. In some examples, the support rod 220 may include two or more rods disposed side by side. In some examples, a cross-section of the support rod 220 is circular or rectangular.

The branch rod 222 may be connected between the wireless charging module 100 and the main rod 221. The branch rod 222 is designed as a retractable structure, and the branch rod 222 drives the wireless charging module 100 to approach or move away from the main rod 221 by extension and retraction. Alternatively, the branch rod 222 is rotatably connected to the main rod 221, and the branch rod 222 drives the wireless charging module 100 to approach or move away from the main rod 221 by rotating relative to the main rod 221. For example, the branch rod 222 rotates relative to the main rod 221, so that an angle between the branch rod 222 and the main rod 221 can be adjusted between 0° and 180°, and the branch rod 222 can switch between a working state and a folding state. When the angle between the branch rod 222 and the main rod 221 is 0°, the branch rod 222 is in the folding state; and when the angle between the branch rod 222 and the main rod 221 is 45° to 135°, the branch rod 222 is in the working state. By changing the shape of the support rod 220, the wireless charging apparatus 1 can be easily folded and stored. The wire 230 can be threaded through the branch rod 222 and the main rod 221. When the branch rod 222 rotates relative to the main rod 221, the wire 230 can deform accordingly.

The branch rod 222 may be rotatably connected to the main rod 221, so that the wireless charging module 100 can rotate around the main rod 221 in a circumferential direction of the main rod 221. In this way, the position of the wireless charging module 100 can be easily adjusted, and the wireless charging apparatus 1 can be used in more scenarios. The wire 230 can be threaded through the branch rod 222 and the main rod 221. When the branch rod 222 rotates relative to the main rod 221, the wire 230 can deform accordingly.

The wireless charging module 100 may include a back wireless charging assembly, a back charging region corresponding to the back wireless charging assembly 140 is formed on the first shell 110, and the back wireless charging assembly is connected to the second shell 120 or the first shell 110 to charge another to-be-charged device in the back charging region. In this way, the wireless charging module 100 can charge different to-be-charged devices simultaneously, which is beneficial to improving the functional richness of the wireless charging module 100.

The wireless charging module 100 may include a back wireless charging assembly and a third shell, a back charging region corresponding to the back wireless charging assembly is formed on the third shell, the third shell is rotatably connected to the first shell 110, and the third shell is rotatable in the circumferential direction D1 of the first shell 110. The wireless charging assembly is connected to the third shell or the first shell 110 to charge a to-be-charged device. The third shell can be connected to the second shell 120 through the first shell 110. In this way, the wireless charging module 100 can charge different to-be-charged devices simultaneously, which is beneficial to improving the functional richness of the wireless charging module 100.

Another to-be-charged device can be magnetically limited to the back charging region by the magnetic attraction assembly 130, or attracted to the back charging region by other magnets. Further, the back charging region and the charging region 123 are located on two opposite sides of the wireless charging module 100.

A battery module (not shown) (e.g., one or more batteries) may be provided inside the base 210, and the battery module may be used for supplying power to the wireless charging apparatus 1.

As shown in FIG. 2 and FIG. 3, the magnetic attraction assembly (e.g., magnetic devices) 130 may include a plurality of magnets arranged in the circumferential direction D1 of the first shell 110. Further, the plurality of magnets are assembled to form a ring structure with a fracture, which facilitates installation and complies with installation standards.

The magnetic attraction assembly 130 may be disposed on an outer circumference of the wireless charging assembly 140 in the circumferential direction D1 of the first shell 110.

As shown in FIG. 1 to FIG. 3, the second shell 120 and the first shell 110 may enclose an accommodating space 160, the magnetic attraction assembly 130 and the wireless charging assembly 140 are both located within the accommodating space 160, and the charging region 123 corresponding to the wireless charging assembly 140 is formed on a side, away from the accommodating space 160, of the second shell 120.

In this way, the second shell 120 and the first shell 110 can protect and shield the magnetic attraction assembly 130 and the wireless charging assembly 140, which can improve the structural stability of the wireless charging module 100.

As shown in FIG. 1 to FIG. 4, the magnetic attraction assembly 130 may be connected to the second shell 120, and the wireless charging assembly 140 is connected to the first shell 110, so that the to-be-charged device, the second shell 120, and the magnetic attraction assembly 130 can rotate together in the circumferential direction D1 of the first shell 110 relative to the first shell 110 and the wireless charging assembly 140.

In this way, when the user adjusts the posture of the to-be-charged device in the circumferential direction D1 of the first shell 110, the second shell 120, the magnetic attraction assembly 130, and the to-be-charged device can rotate synchronously, so that there is no sliding friction between the second shell 120 and the to-be-charged device, the resistance of the magnetic attraction assembly 130 to the rotation of the to-be-charged device is reduced, the smoothness of the rotation of the to-be-charged device is improved, and user effort is reduced. Moreover, in some examples, the wire 230 is threaded through the first shell 110 and extends to the wireless charging assembly 140 to connect with the wireless charging assembly 140. By connecting the wireless charging assembly 140 to the first shell 110, the wireless charging assembly 140 and the first shell 110 can remain relatively fixed, which is conducive to reducing the twisting, stretching, squeezing, and other effects on the wire 230 and reducing the risk of damage to the wire 230.

Further, there may be a gap between the wireless charging assembly 140 and the magnetic attraction assembly 130, that is, the wireless charging assembly 140 is not in contact with the magnetic attraction assembly 130, which can reduce the resistance of the wireless charging assembly 140 to the rotation of the magnetic attraction assembly 130.

In some examples, the wireless charging assembly 140 is detachably connected to the first shell 110. In other examples, the wireless charging assembly 140 is fixedly connected to the first shell 110, for example, by an adhesive.

In some examples, the magnetic attraction assembly 130 is detachably connected to the second shell 120. In other examples, the magnetic attraction assembly 130 is fixedly connected to the second shell 120, for example, by an adhesive.

As shown in FIGS. 1 and 5 to 7, the magnetic attraction assembly 130 and the wireless charging assembly 140 may be both connected to the first shell 110, so that the to-be-charged device and the second shell 120 can rotate together in the circumferential direction D1 of the first shell 110 relative to the first shell 110, the wireless charging assembly 140, and the magnetic attraction assembly 130.

In this way, when the user adjusts the posture of the to-be-charged device in the circumferential direction D1 of the first shell 110, there is no sliding friction between the second shell 120 and the to-be-charged device, which is conducive to improving the smoothness of rotation of the to-be-charged device, reducing the twisting, stretching, squeezing, and other effects on the wire 230 connecting the wireless charging assembly 140, and reducing the risk of damage to the wire 230.

In some examples, the magnetic attraction assembly 130 and the wireless charging assembly 140 are both fixedly connected to the first shell 110.

In some examples, in the assembly process, the magnetic attraction assembly 130 and the wireless charging assembly 140 can be pre-fixed using a fixing disc 143, and then the fixing disc 143, the magnetic attraction assembly 130, and the wireless charging assembly 140 are assembled together on the first shell 110, to improve assembly efficiency.

In some examples, the magnetic attraction assembly 130 and the wireless charging assembly 140 are both detachably connected to the first shell 110.

As shown in FIGS. 1 and 8 to 10, the magnetic attraction assembly 130 and the wireless charging assembly 140 may be both connected to the second shell 120, so that the to-be-charged device can rotate together with the second shell 120, the wireless charging assembly 140, and the magnetic attraction assembly 130 in the circumferential direction D1 of the first shell 110 relative to the first shell 110.

In this way, when the user adjusts the posture of the to-be-charged device in the circumferential direction D1 of the first shell 110, there is no sliding friction between the second shell 120 and the to-be-charged device, which can improve the smoothness of rotation of the to-be-charged device and reduce the resistance of the magnetic attraction assembly 130 to the rotation of the to-be-charged device. In addition, by configuring the wireless charging assembly 140 to rotate synchronously with the to-be-charged device, the stability of the process of charging the to-be-charged device by the wireless charging assembly 140 is improved.

Specifically, the sliding friction refers to friction between the second shell 120 and the supported device when the two slide relative to each other, and the friction between the second shell 120 and the supported device when the two are fixed relative to each other is static friction. In some examples, the second shell 120 has strong magnetic attraction to the to-be-charged device, or the friction coefficient between the second shell 120 and the to-be-charged device is large. When the user adjusts the posture of the to-be-charged device in the circumferential direction D1 of the first shell 110, there is no sliding friction between the second shell 120 and the to-be-charged device, that is, the second shell 120 rotates completely synchronously with the to-be-charged device. In other examples, the second shell 120 has weak magnetic attraction to the to-be-charged device, or the friction coefficient between the second shell 120 and the to-be-charged device is small. When the user adjusts the posture of the to-be-charged device in the circumferential direction D1 of the first shell 110, there is sliding friction between the second shell 120 and the to-be-charged device, that is, the second shell 120 does not rotate completely synchronously with the to-be-charged device.

In some examples, the magnetic attraction assembly 130 and the wireless charging assembly 140 are both fixedly connected to the second shell 120.

In some examples, the magnetic attraction assembly 130 and the wireless charging assembly 140 are both detachably connected to the second shell 120.

Figure 8:
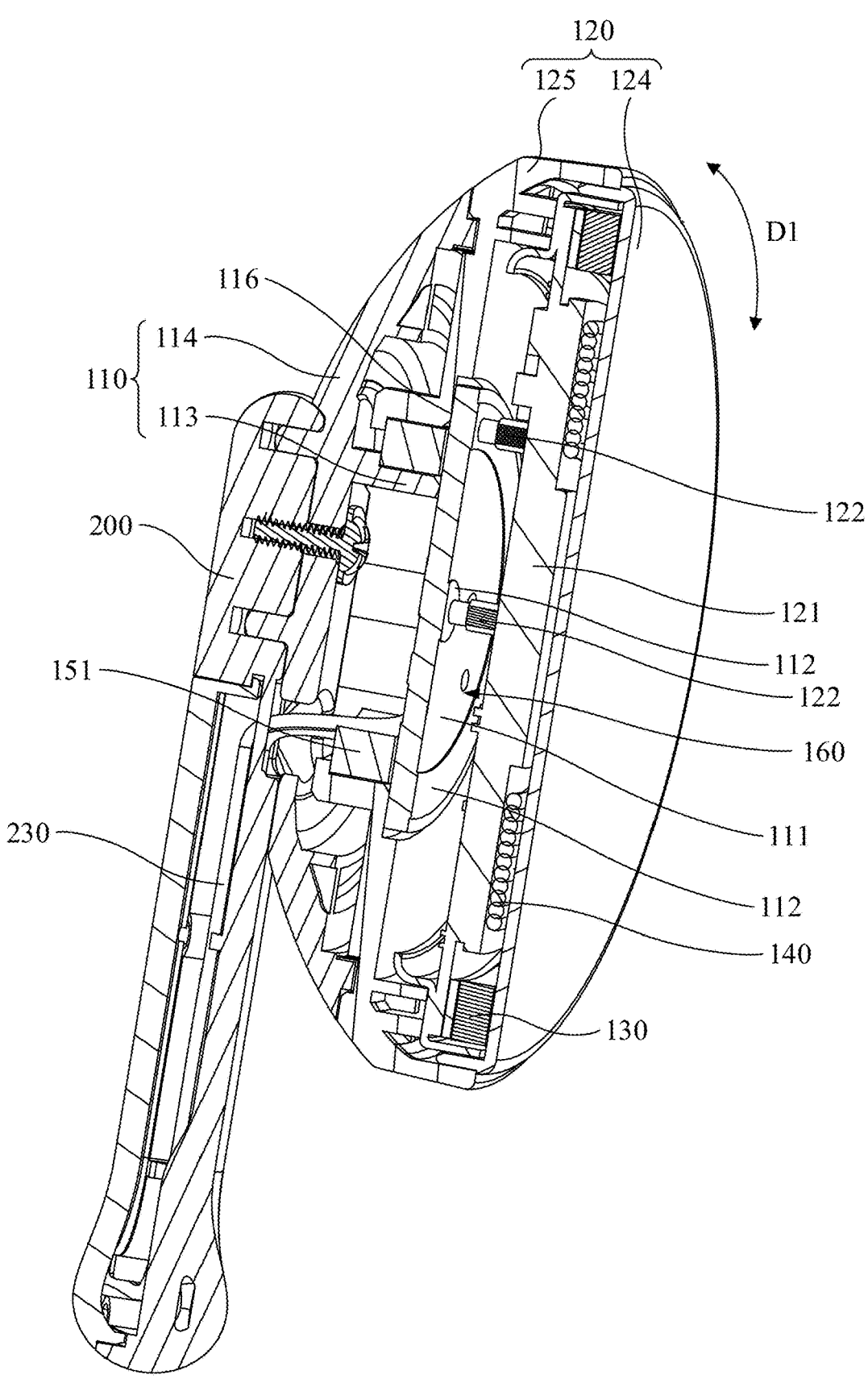
FIG. 8 is a schematic diagram of a partial cross-sectional structure of an example of the wireless charging apparatus in the present application.

As shown in FIG. 8, the wireless charging module 100 may include two elastic conductive contacts 122 and two conductive portions 112 that correspondingly abut against each other, the two elastic conductive contacts 122 are disposed on one of the second shell 120 and the first shell 110, and the two conductive portions 112 are disposed on the other of the second shell 120 and the first shell 110. The wireless charging assembly 140 is connected to the power source through the two elastic conductive contacts 122 and the two conductive portions 112.

Specifically, the wireless charging module 100 includes elastic conductive contacts 122 and conductive portions 112 that correspondingly abut against each other and can slide relative to each other. The elastic conductive contacts 122 are disposed on the second shell 120 and electrically connected to the wireless charging assembly 140, and the conductive portions 112 are disposed on the first shell 110 and electrically connected to the power source through the wire 230, so that the wireless charging assembly 140 is electrically connected to the power source through the elastic conductive contacts 122 and the conductive portions 112. Alternatively, the conductive portions 112 are disposed on the second shell 120 and electrically connected to the wireless charging assembly 140, and the elastic conductive contacts 122 are disposed on the first shell 110 and electrically connected to the power source through the wire 230, so that the wireless charging assembly 140 is electrically connected to the power source through the elastic conductive contacts 122 and the conductive portions 112.

Two or more, such as 3 or 4, elastic conductive contacts 122 and conductive portions 112 can be configured. The two elastic conductive contacts 122 and the two conductive portions 112 can abut against each other one to one. The area of a region, abutting against the elastic conductive contact 122, of the conductive portion 112, may be larger than that of a region, abutting against the conductive portion 112, of the elastic conductive contact 122, so when the second shell 120 rotates relative to the first shell 110, the elastic conductive contact 122 can slide relative to the corresponding conductive portion 112 without detaching from the corresponding conductive portion 112.

For example, the first shell 110 is fixedly disposed relative to the conductive portion 112, and the second shell 120 is fixedly disposed relative to the elastic conductive contact 122. The power source may be a grid output end, or a battery module disposed inside the base 210. The wire 230 can extend to connect with the conductive portion 112 after being led out from the power source, and the wireless charging assembly 140 is connected to the elastic conductive contact 122, so that the wireless charging assembly 140 can be connected to the power source.

By replacing a portion of the wire 230 with the elastic conductive contact 122 and the conductive portion 112 that slide relative to each other, the wire 230 is less prone to twisting damage when the second shell 120 rotates relative to the first shell 110, and there will be no obstruction to the relative rotation of the second shell 120 and the first shell 110 due to the pulling of the wireless charging assembly 140 by the wire 230, thereby prolonging the service life of the wireless charging apparatus 1 and improving the smoothness of rotation of the to-be-charged device.

The elastic conductive contact 122 may be a spring pin type connector. The conductive portion 112 may be a metal foil, such as a copper foil or an aluminum foil. The elastic conductive contact 122 may be a spring pin. In some examples, the conductive contact is a non-elastic conductive contact.

As shown in FIG. 8, one of the two conductive portions 112 may be annular and surround the other of the two conductive portions 112.

For example, one of the two conductive portions 112 is annular and the other is circular, and the annular conductive portion 112 surrounds the circular conductive portion 112. Correspondingly, when the second shell 120 rotates relative to the first shell 110, the elastic conductive contact 122 abutting against the annular conductive portion 112 slides in a circumferential direction of the annular conductive portion 112, and the sliding trajectory surrounds the elastic conductive contact 122 abutting against the circular conductive portion 112. Further, when the second shell 120 rotates relative to the first shell 110, the elastic conductive contact 122 abutting against the circular conductive portion 112 rotates. For example, the two conductive portions 112 are annular. For another example, the two conductive portions 112 are arc-shaped.

This configuration allows the second shell 120 to rotate relative to the first shell 110 in a full or multiple turns, and makes the structures of the two conductive portions 112 compact when the conductive portions 112 are spaced apart at an enough distance, to improve space utilization.

As shown in FIG. 8, the wireless charging module 100 may include a first board 121 and a second board 111 opposite to each other. The first board 121 may be disposed on the second shell 120 and electrically connected to the wireless charging assembly 140, and the second board 111 may be disposed on the first shell 110. The two elastic conductive contacts 122 may be disposed on one of the first board 121 and the second board 111, and the two conductive portions 112 may be disposed on the other of the first board 121 and the second board 111.

The elastic conductive contacts 122 and the conductive portions 112 are disposed on the first board 121 and the second board 111 respectively, which is beneficial to the assembly of the wireless charging module 100 and improves the connection stability of the elastic conductive contacts 122 and the conductive portions 112, thereby improving the connection stability of the wireless charging assembly 140 and the power source.

For example, the two conductive portions 112 may be printed on a surface of the first board 121 or the second board 111. Further, the first board 121 and the second board 111 may be spaced apart, which is beneficial to the heat dissipation of the wireless charging assembly 140.

The first board 121 may be the foregoing heat dissipation circuit board, control circuit board, or circuit board assembly 170. The second board 111 may be a circuit board, which facilitates the connection of the conductive portions 112 or the elastic conductive contacts 122 with the wire 230.

Figure 4:
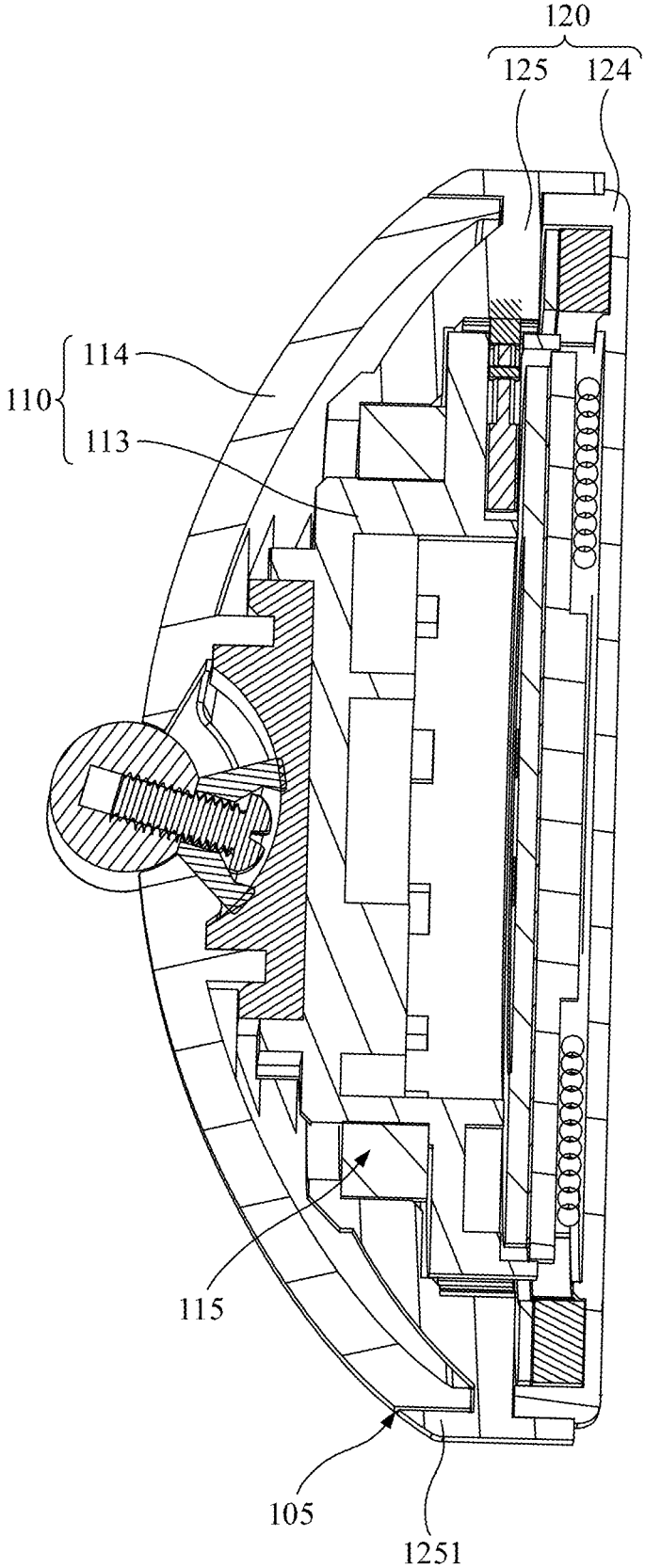
FIG. 4 is a schematic diagram of a partial cross-sectional structure of an example of the wireless charging apparatus in the present application.

As shown in FIG. 2 to FIG. 4, a bearing 151 may be disposed between the second shell 120 and the first shell 110. The second shell 120 rotates relative to the first shell 110 through the bearing 151. The bearing 151 is beneficial to improving the smoothness of relative rotation of the second shell 120 and the first shell 110, and the bearing 151 can have the characteristic of easy assembly.

An inner ring of the bearing 151 may be sleeved on the first shell 110, and the second shell 120 is sleeved on an outer ring of the bearing 151. This configuration is beneficial to reducing the size of the first shell 110 and increasing the size of the second shell 120. On the one hand, due to the shielding of the second shell 120, it is uneasy to see the first shell 110 from a side, to which the to-be-charged device is attached, of the wireless charging module 100, which is beneficial to improving appearance aesthetics. On the other hand, the area of the region for placing the to-be-charged device on the surface of the first shell 110 is increased.

As shown in FIG. 2 to FIG. 4, the first shell 110 may include an inner shell 113 and an outer shell 114. The second shell 120 and the inner shell 113 may enclose the accommodating space 160, and the magnetic attraction assembly 130 and the wireless charging assembly 140 are located within the accommodating space 160. The outer shell 114 is located on a periphery of the inner shell 113, a mounting space 115 is formed between the outer shell 114 and the inner shell 113, the bearing 151 is disposed inside the mounting space 115 and sleeved on the periphery of the inner shell 113, and the second shell 120 extends into the mounting space 115 and abuts against the outer ring of the bearing 151.

By placing the bearing 151 inside the mounting space 115, the outer shell 114 can shield and protect the bearing 151, which is beneficial to maintaining a stable assembly relationship of the bearing 151 with the inner shell 113 and the second shell 120, improving the structural stability of the wireless charging module 100, and improving the appearance aesthetics of the wireless charging module 100.

Further, the wireless charging assembly 140 may be mounted on the inner shell 113, and the inner shell 113 may be provided with a heat dissipation space 1131 to promote the heat dissipation of the wireless charging assembly 140. Both the inner shell 113 and the outer shell 114 may be provided with reinforcing ribs 1132 to increase strength, ensure uniform wall thickness, and reduce surface collapse caused by uneven shrinkage during molding.

As shown in FIG. 2 to FIG. 4, the periphery of the inner shell 113 has a mounting step 1162, and the bearing 151 can be mounted on the mounting step 1162 for easy mounting of the bearing 151. The inner shell 113 and the outer shell 114 may be fixed by screws.

As shown in FIG. 2 to FIG. 4, the second shell 120 may include an upper cover 124 and a middle frame 125, one end of the middle frame 125 has a mounting port (not shown), the magnetic attraction assembly 130 and the wireless charging assembly 140 can be mounted through the mounting port, and the upper cover 124 can be used for blocking the mounting port. The charging region 123 is located on an outer side of the upper cover 124. The other end of the middle frame 125 can extend into the mounting space 115 and abut against the outer ring of the bearing 151. This configuration facilitates the assembly of the wireless charging module 100. In some examples, the magnetic attraction assembly 130 can be fixed to the upper cover 124. In other examples, the fixing disc 143, the magnetic attraction assembly 130, and the wireless charging assembly 140 can be jointly assembled on the upper cover 124. The upper cover 124 and the middle frame 125 may be connected by glue or by buckles.

As shown in FIG. 1 and FIGS. 2 to 4, the wireless charging module 100 may have a front surface 102, a back surface 103, and a peripheral side surface 104 connected between the front surface 102 and the back surface 103. The front surface 102 is used for holding the to-be-charged device, the support mechanism 200 is connected to the first shell 110 on the back surface 103, and a seam 105 between the second shell 120 and the first shell 110 on an outer surface of the wireless charging module 100 is located on the back surface 103 or the peripheral side surface 104. The second shell 120 can shield the first shell 110 on the front surface 102 of the wireless charging module 100, so that the seam 105 between the second shell 120 and the first shell 110 is located on the back surface 103 or the peripheral side surface 104.

The seam 105 between the second shell 120 and the first shell 110 refers to the seam 105 at the junction of the second shell 120 and the first shell 110. For example, the seam 105 between the second shell 120 and the first shell 110 on the outer surface of the wireless charging module 100 may include the seam 105 between the middle frame 125 and the first shell 110. Further, the seam 105 between the second shell 120 and the first shell 110 on the outer surface of the wireless charging module 100 may include the seam 105 between the middle frame 125 and the outer shell 114.

In some examples, as shown in FIG. 1 and FIG. 2, the seam 105 between the second shell 120 and the first shell 110 on the outer surface of the wireless charging module 100 is located on the peripheral side surface 104. In some examples, as shown in FIG. 1 and FIG. 4, the middle frame 125 has a shielding portion 1251 located on the peripheral side surface 104, and the shielding portion 1251 can shield the first shell 110 on the peripheral side surface 104, so that the seam 105 between the second shell 120 and the first shell 110 on the outer surface of the wireless charging module 100 is located on the back surface 103. This configuration is beneficial to improving the appearance aesthetics of the wireless charging apparatus 1.

Figure 5:
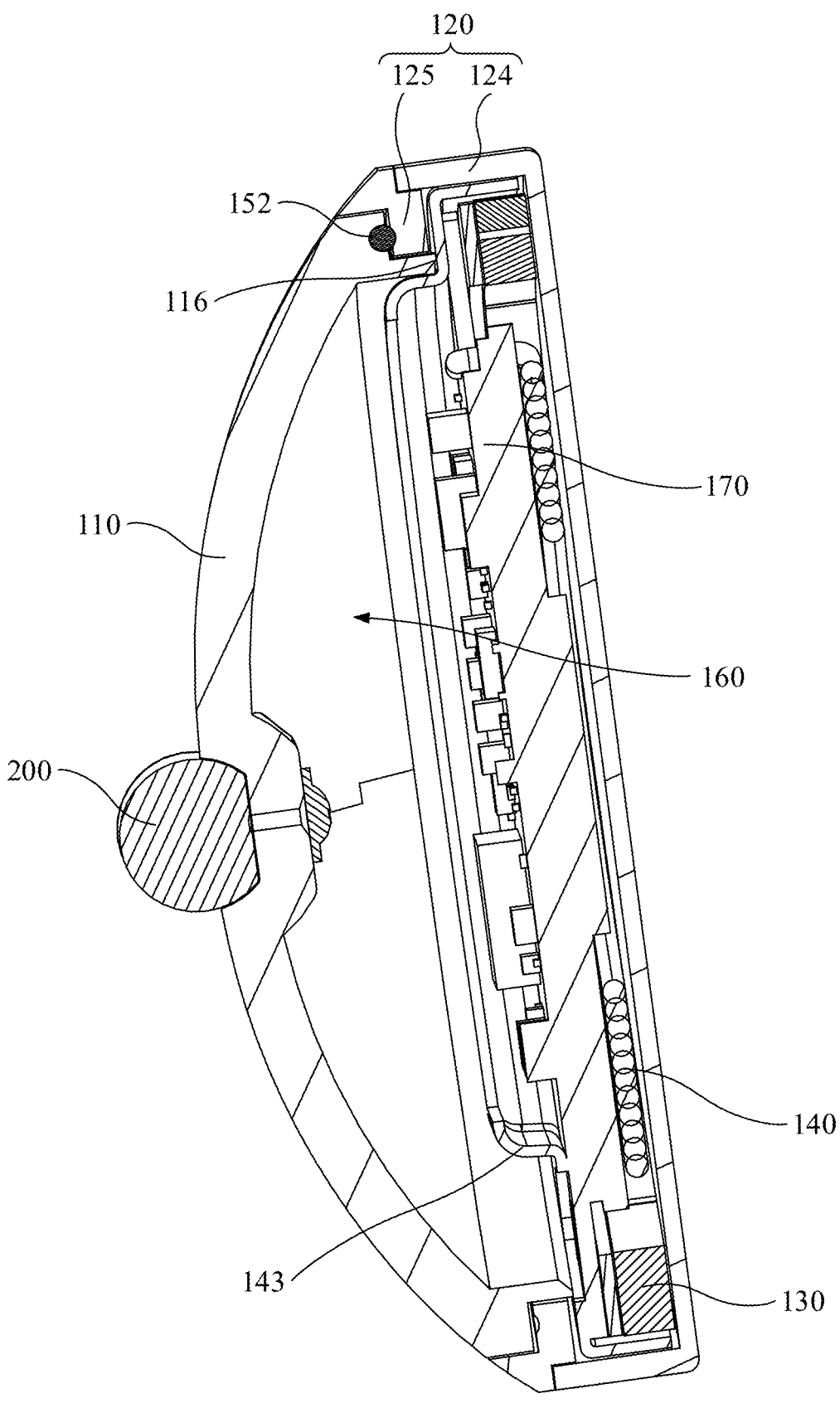
FIG. 5 is a schematic diagram of a partial cross-sectional structure of an example of the wireless charging apparatus in the present application.
Figure 6:
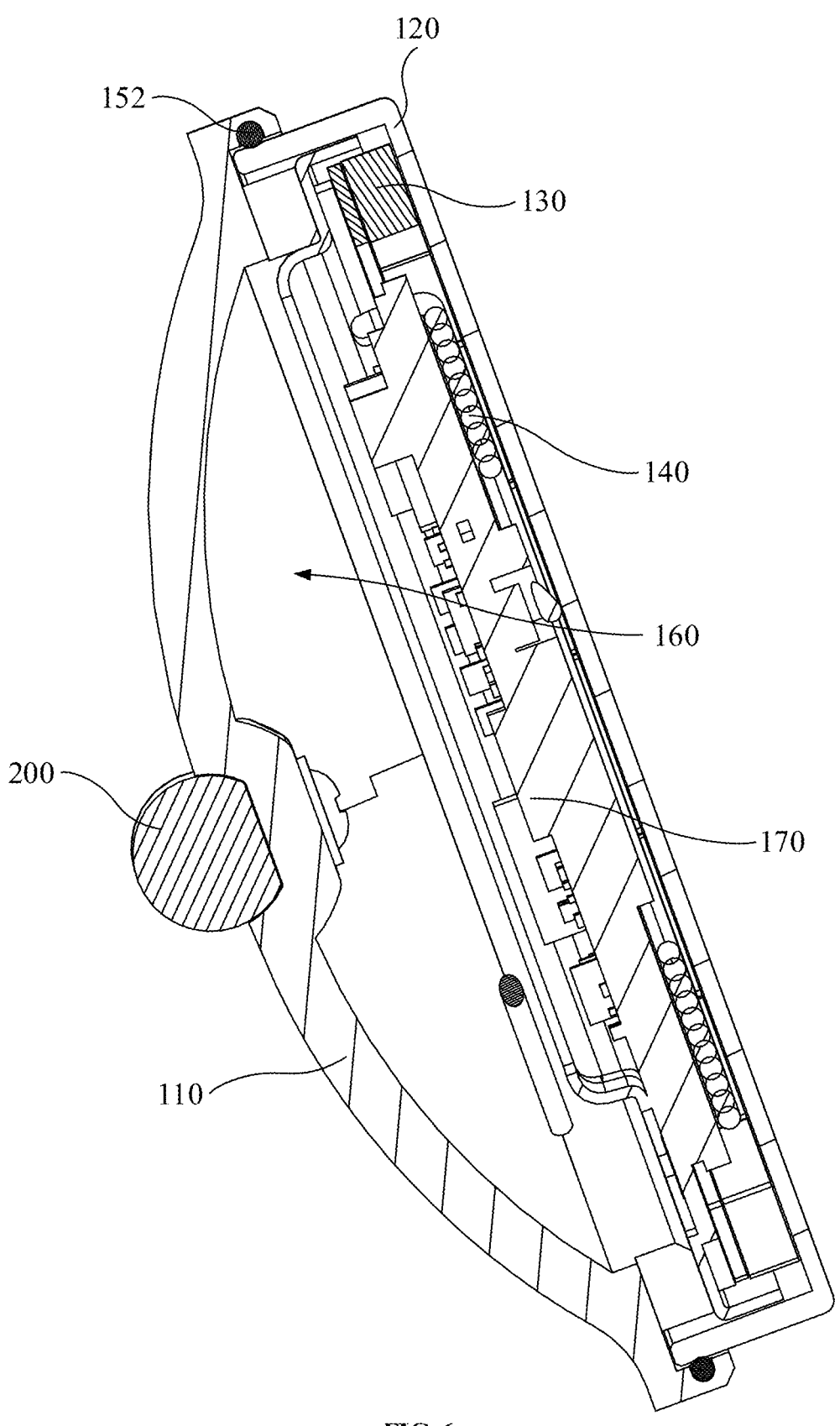
FIG. 6 is a schematic diagram of a partial cross-sectional structure of an example of the wireless charging apparatus in the present application.
Figure 7:
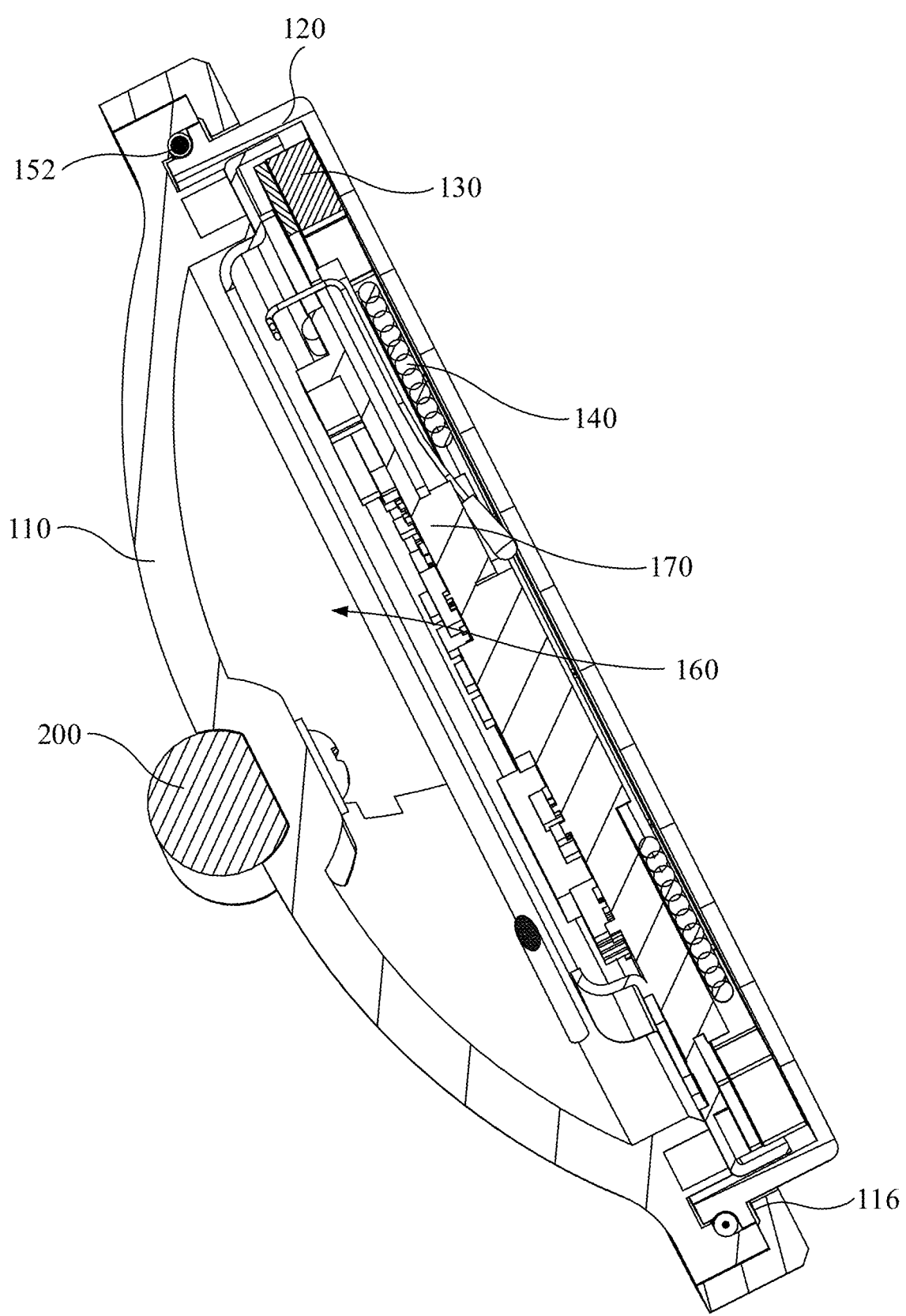
FIG. 7 is a schematic diagram of a partial cross-sectional structure of an example of the wireless charging apparatus in the present application.

As shown in FIG. 5 to FIG. 7, a rolling element 152 may be provided between the second shell 120 and the first shell 110. The second shell 120 rotates relative to the first shell 110 through the rolling element 152.

The rolling element 152 is beneficial to improving the smoothness of relative rotation of the second shell 120 and the first shell 110, and the rolling element 152 can have the characteristic of small volume. For example, the rolling element 152 may be a ball, a rolling pin (e.g., a rolling ball), a cylindrical roller, or the like. The quantity of the rolling element 152 may be plural, and the plurality of rolling elements 152 can be distributed at intervals or continuously in the circumferential direction D1 of the first shell 110.

In some examples, the rolling element 152 is located between the upper cover 124 and the first shell 110. In other examples, the rolling element 152 is located between the middle frame 125 and the first shell 110.

In some examples, one of the second shell 120 and the first shell 110 is provided with a groove (not shown) to accommodate the rolling element 152, and an opening direction of the groove is parallel or perpendicular to an axis direction of rotation of the second shell 120 relative to the first shell 110. In some examples, the bearing 151 and the rolling element 152 may not be provided between the second shell 120 and the first shell 110.

As shown in FIGS. 1, 2, and 7 to 9, the first shell 110 may be provided with a stop surface 116 distributed in the circumferential direction D1 of the first shell 110, and the stop surface 116 is used for stopping the second shell 120 to limit the second shell 120 from detaching from the first shell 110. A plurality of stop surfaces 116 may be distributed at intervals or continuously in the circumferential direction D1 of the first shell 110.

Specifically, the stop surface 116 is used for limiting the second shell 120 from detaching from the first shell 110 in an extension direction of its rotation axis relative to the first shell 110. In some examples, as shown in FIG. 1 and FIG. 2, the stop surface 116 is located within the mounting space 115 and on a step surface of the aforementioned mounting step 1162.

Figure 9:
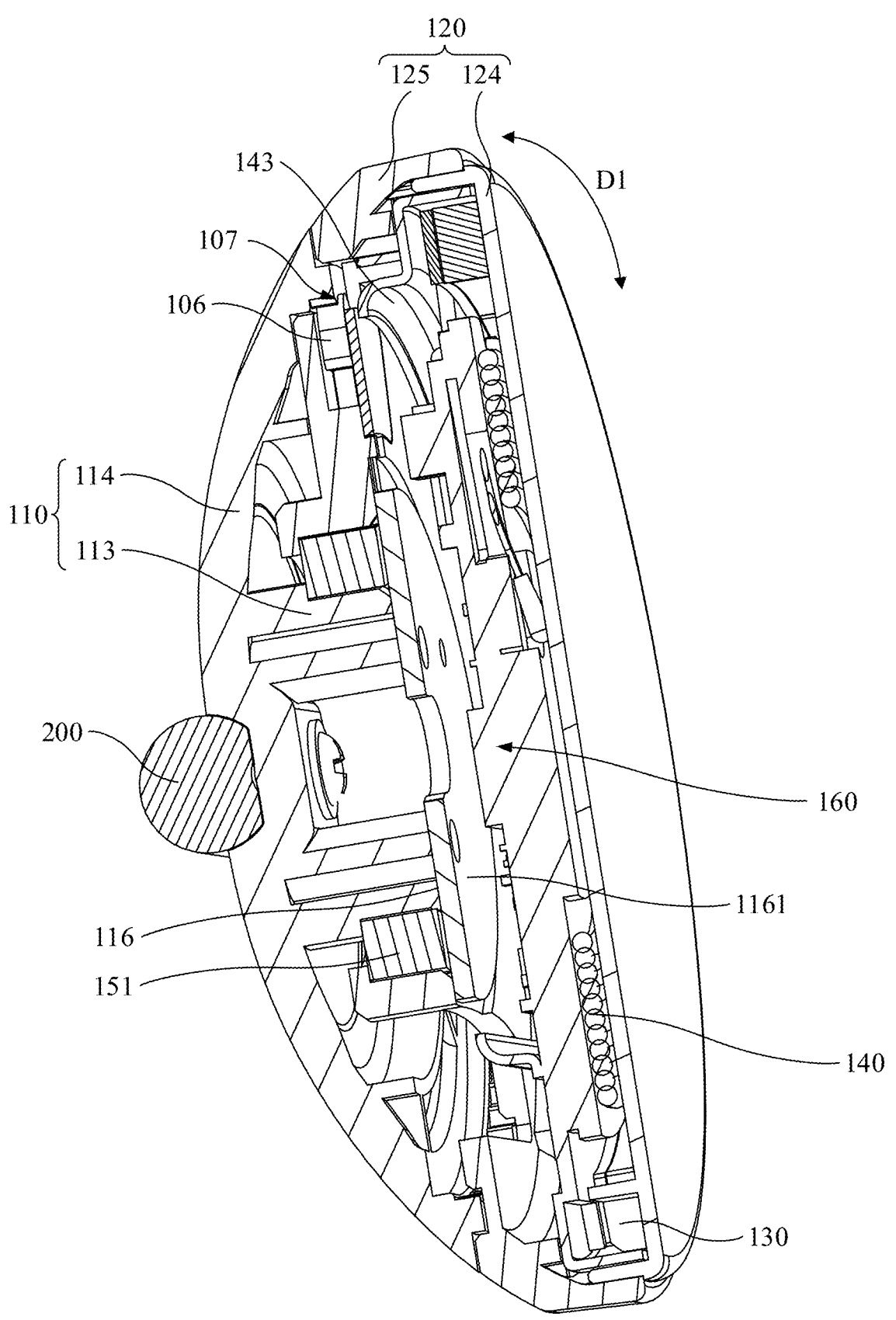
FIG. 9 is a schematic diagram of a partial cross-sectional structure of an example of the wireless charging apparatus in the present application.

In other examples, as shown in FIG. 9, a stop board 1161 is fixed on the inner shell 113, and the stop surface 116 is located at an edge of a side of the stop board 1161. In some examples, as shown in FIG. 8 and FIG. 9, a side, away from the stop surface 116, of the stop board 1161 can be used for disposing the conductive portions 112, that is, the stop board 1161 can be used as the second board 111.

In other examples, as shown in FIG. 5, the fixing disc 143 is fixed to the first shell 110, and the stop surface 116 is located at an edge of a side, away from the wireless charging assembly 140, of the fixing disc 143.

Further, the stop surface 116 is used for stopping the middle frame 125 to limit the second shell 120 from detaching from the first shell 110. In this way, the stop surface 116 can allow the second shell 120 to rotate relative to the first shell 110, so as to limit the second shell 120 from detaching from the first shell 110.

As shown in FIG. 2 and FIG. 3, one of the second shell 120 and the first shell 110 may be provided with an elastic raised member 106, the other of the second shell 120 and the first shell 110 is provided with a plurality of buckle grooves 107 distributed in the circumferential direction D1 of the first shell 110, and the plurality of buckle grooves 107 are used for engaging with the elastic raised member 106.

Specifically, the second shell 120 is provided with the elastic raised member 106, the plurality of buckle grooves 107 distributed in the circumferential direction D1 of the first shell 110 are provided in the first shell 110, and the plurality of buckle grooves 107 are used for engaging with the elastic raised member 106. Alternatively, the first shell 110 is provided with the elastic raised member 106, the plurality of buckle grooves 107 distributed in a circumferential direction of the second shell 120 are provided in the second shell 120, and the plurality of buckle grooves 107 are used for engaging with the elastic raised member 106.

For example, in some examples, the elastic raised member 106 is disposed on the inner shell 113, the middle frame 125 is of a ring structure, and the plurality of buckle grooves 107 are disposed on an inner ring of the middle frame 125. For another example, the elastic raised member 106 is disposed on an outer ring of the middle frame 125, and the plurality of buckle grooves 107 are disposed on an inner surface of the outer shell 114.

By configuring the elastic raised member 106 to engage with the buckle grooves 107, the relative rotation of the second shell 120 and the first shell 110 can be limited to some extent, which is beneficial to maintaining the posture stability of the to-be-charged device. When the second shell 120 is stressed, the second shell 120 rotates relative to the first shell 110. Meanwhile, the elastic raised member 106 can disengage from the original buckle groove 107 to allow the second shell 120 to rotate relative to the first shell 110.

As the second shell 120 continuously rotates relative to the first shell 110, the elastic raised member 106 continuously snaps into the new buckle groove 107 until the second shell 120 stops rotating relative to the first shell 110.

The elastic raised member 106 may be a spring pin. Alternatively, the elastic raised member 106 is a component made of elastic plastic, silicone, or rubber, connected to the second shell 120 or the first shell 110 through an elastic arm, and deformed by the elastic arm to disengage from or snap into the buckle groove 107. In some examples, the elastic raised member 106 is formed by bending a metal sheet into a corrugated shape, and a deformation space is formed after the metal sheet is bent, so as to allow the metal sheet to deform to disengage from or snap into the buckle groove 107.

Figure 10:
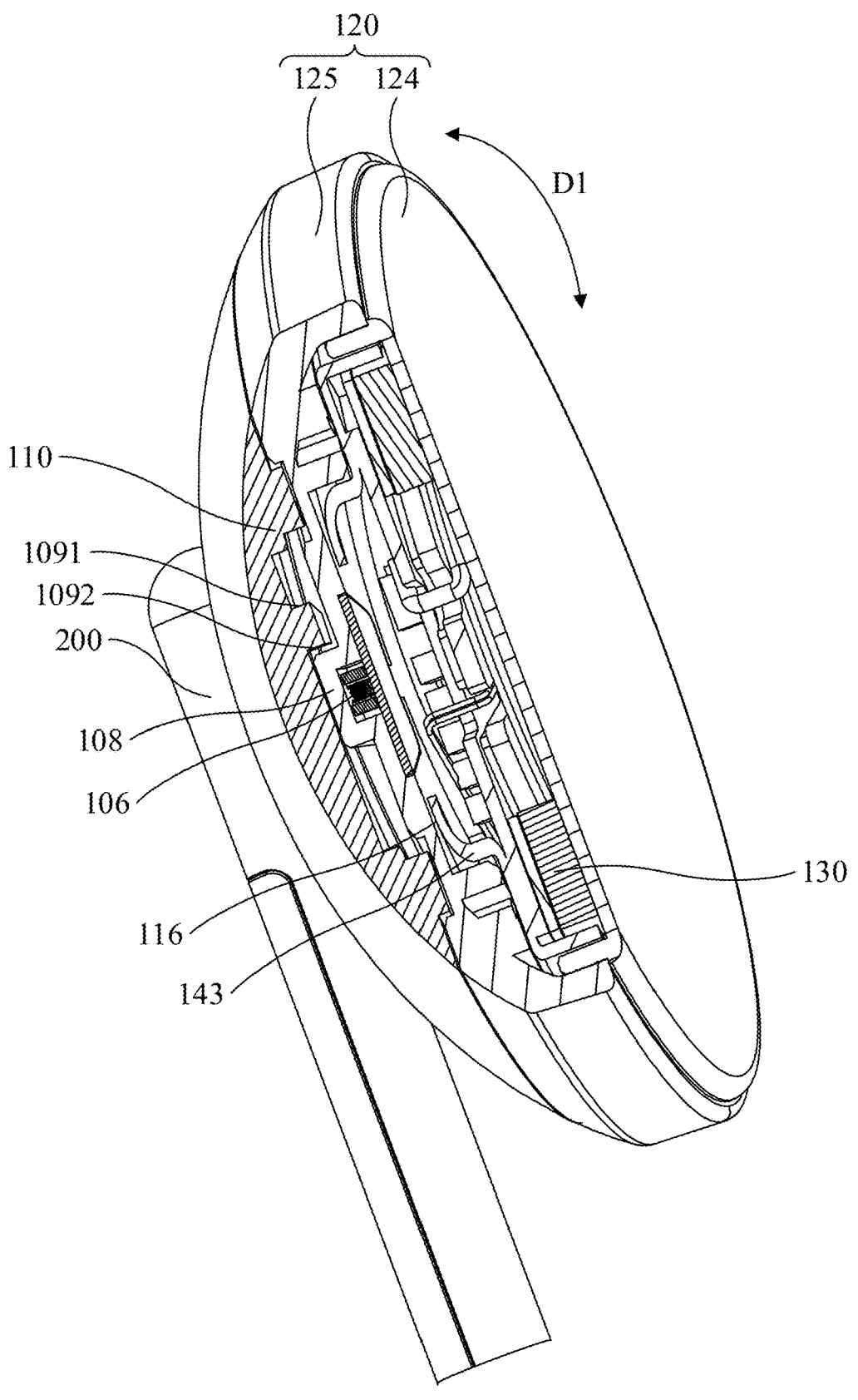
FIG. 10 is a schematic diagram of another cross-section of the structure shown in FIG. 9.

As shown in FIGS. 1, 9, and 10, one of the second shell 120 and the first shell 110 may be provided with a limiting portion 108, and in the circumferential direction D1 of the first shell 110, the other of the second shell 120 and the first shell 110 is provided with a first limiting surface 1091 and a second limiting surface 1092 at interval (e.g., angularly displaced from the first limiting surface). The limiting portion 108 is movably located between the first limiting surface 1091 and the second limiting surface 1092, to limit the relative rotation of the second shell 120 and the first shell 110 by abutting against the first limiting surface 1091 or the second limiting surface 1092.

In this way, the angle of the relative rotation of the second shell 120 and the first shell 110 can be limited within a range, thereby reducing the twisting, stretching, squeezing, and/or other effects on the wire 230 connecting the wireless charging assembly 140 and reducing the risk of damage to the wire 230. For example, the second shell 120 and the first shell 110 have an initial relative position, and rotation directions of the second shell 120 relative to the first shell 110 include forward rotation and reverse rotation. At the initial relative position, the limiting portion 108 in the circumferential direction D1 of the first shell 110 is located at a middle position between the first limiting surface 1091 and the second limiting surface 1092, the second shell 120 can rotate, for example, 170° relative to the first shell 110 forward and abut against the first limiting surface 1091 but cannot continue to rotate, and the second shell 120 can rotate, for example, 170° relative to the first shell 110 reversely and abut against the second limiting surface 1092 but cannot continue to rotate. Therefore, the twisting, stretching, squeezing, and other effects on the wire 230 are limited.

Alternatively, in some examples, the second shell 120 and the first shell 110 may not be provided with the limiting portion 108, the first limiting surface 1091, and the second limiting surface 1092, to allow the second shell 120 to rotate relative to the first shell 110 by one or more turns.

In some examples, the second shell 120 and the first shell 110 can be rotatably connected by threads. The first limiting surface 1091 and the second limiting surface 1092 can be disposed at two ends of the threads. The first limiting surface 1091 and the second limiting surface 1092 may be flat surfaces or curved surfaces.

A protrusion is formed on the second shell 120 and the first shell 110 respectively, the protrusion formed on one of the second shell 120 and the first shell 110 may be the limiting portion 108 (e.g., a limit plate, a limit block), and the first limiting surface 1091 and the second limiting surface 1092 may be two side surfaces of the protrusion formed on the other of the second shell 120 and the first shell 110, or the first limiting surface 1091 and the second limiting surface 1092 may be located on two different protrusions formed on the other of the second shell 120 and the first shell 110. Further, the first limiting surface 1091 and the second limiting surface 1092 are disposed on the first shell 110, and the limiting portion 108 is formed at a position where the elastic raised member is disposed on the middle frame 125, which are conducive to compact layout on the second shell 120.

Further, the limiting portion 108, the first limiting surface 1091, and the second limiting surface 1092 are configured so that the relative rotation angle between the second shell 120 and the first shell 110 is more than 90° and less than 180°, which facilitates the adjustment on the posture of the to-be-charged device and can reduce the force acting on the wire 230. For example, if the to-be-charged device is a mobile phone and the user places the phone on the wireless charging module 100, the mobile phone may tilt. The user can rotate the phone in the circumferential direction D1 of the first shell 110 by an angle to straighten the phone. Then, the user can rotate the phone in the same direction by 90° to switch between horizontal and vertical screens. The sum of the two rotation angles is greater than 90°. If the relative rotation angle between the second shell 120 and the first shell 110 is not more than 90°, it is not conducive to the adjustment on the posture of the to-be-charged device. Therefore, at the initial relative position, the angle at which the second shell 120 can rotate forward and reversely relative to the first shell 110 can be set to be close to 180°, such as 140°-155°, or greater than 155° and less than 175°.

As shown in FIG. 1 and FIG. 2, the second shell 120 may be rotatable relative to the first shell 110 about a first reference axis L1. The support mechanism 200 may be rotatably connected to the first shell 110, and the second shell 120 and the first shell 110 are rotatable relative to the support mechanism 200 together about a second reference axis L2. An extension direction of the first reference axis L1 may intersect with that of the second reference axis L2. Further, the first reference axis L1 may be perpendicular to the second reference axis L2. The first reference axis L1 may be an axis of rotation of the second shell 120 relative to the first shell 110, and the second reference axis L2 may be an axis of rotation of the first shell 110 relative to the support mechanism 200.

This can increase the freedom of motion of the second shell 120, thereby increasing the freedom of motion of the to-be-charged device and facilitating the adjustment on the posture of the to-be-charged device. Further, when the wireless charging apparatus 1 is operating, the second reference axis L2 is parallel or approximately parallel to a horizontal plane, which can adjust the pitch angle of the to-be-charged device. For example, when the to-be-charged device is a mobile phone, the user can easily view the phone by adjusting the pitch angle of the phone.

In some examples, the second shell 120 has a cylindrical outer side surface, and the first reference axis L1 is located at a central axis position of the outer side surface of the second shell 120.

In some examples, the second shell 120 has a flat support region for placing a device to be supported, and the second reference axis L2 is parallel to the support region.

Further, the extension direction of the first reference axis L1 is perpendicular to that of the second reference axis L2.

As shown in FIG. 1, the support rod 220 is rotatable relative to the base 210 about a third reference axis L3. An extension direction of the third reference axis L3 is perpendicular to a height direction of the support mechanism 200. In this way, the support rod 220 rotates relative to the base 210 to adjust the pitch angle of the to-be-charged device. The third reference axis L3 is an axis of rotation of the support rod 220 relative to the base 210. In some examples, the third reference axis L3 is parallel to the second reference axis L2. In other examples, the extension direction of the third reference axis L3 is perpendicular to that of the second reference axis L2.

As shown in FIG. 1, the base 210 may include a first base body and a second base body that are rotatably connected. The first base body is rotatable relative to the second base body about a fourth reference axis L4. The fourth reference axis L4 is an axis of rotation of the first base body relative to the second base body. Further, the fourth reference axis L4 intersects with the second reference axis L2. For example, the third reference axis L3 extends in the height direction of the support mechanism 200, and the second reference axis L2 is perpendicular to the height direction of the support mechanism 200. This configuration is beneficial to increasing the freedom of motion of the to-be-charged device. In some examples, the first base body and the second base body can rotate relative to each other by at least one turn, which enables the to-be-charged device to rotate 360° about the fourth reference axis L4.

The peripheral surface of the first shell 110 may be approximately a portion of a spherical surface, the support mechanism 200 is connected to a central position of the peripheral surface of the first shell 110, and the central position of the peripheral surface of the first shell 110 protrudes outward, thereby reducing the probability of mutual interference between the support mechanism 200 and the first shell 110 during relative rotation.

As shown in FIG. 1 and FIG. 2, the support mechanism 200 may include a support rod 220 and a base 210 connected to each other, where the support rod 220 is rotatably connected to the first shell 110.

In other examples, the support rod 220 may be fixedly connected to the first shell 110.

As shown in FIG. 1 to FIG. 4, the support mechanism 200 may be provided with a ball head 201, the first shell 110 is provided with a connecting groove 117, an elastic member 118 is provided inside the connecting groove 117, and the ball head 201 rotatably extends into the connecting groove 117 and elastically abuts against the elastic member 118.

When the support mechanism 200 rotates relative to the first shell 110, the ball head 201 can rotate in the connecting groove 117 and slide relative to the elastic member 118. The ball head 201 can be inserted into the connecting groove 117, thereby limiting the support mechanism 200 from detaching from the first shell 110. The first shell 110 can shield the ball head 201 to improve appearance aesthetics. The ball head 201 elastically abuts against the elastic member 118, which can increase the rotation resistance of the ball head 201 in the connecting groove 117 and prevent the ball head 201 from deviating from its operating position due to looseness.

The elastic member 118 may form a bottom surface of the connection groove 117. Further, the elastic member 118 may comprise a plastic, silicone, and/or rubber member.

As shown in FIG. 1 to FIG. 4, the elastic member 118 may have a first half cylindrical surface 119, the ball head 201 has a second half cylindrical surface 202 abutting against the first half cylindrical surface 119, and a generatrix extension direction of the first half cylindrical surface 119 and a generatrix extension direction of the second half cylindrical surface 202 are both parallel to the second reference axis L2. That the generatrix extension directions of the first half cylindrical surface 119 and the second half cylindrical surface 202 are both parallel to the second reference axis L2 also include: the generatrix extension directions of the first half cylindrical surface 119 and the second half cylindrical surface 202 are approximately parallel to the second reference axis L2. Further, the second reference axis L2 is a central axis of the first half cylindrical surface 119. The central axes of the first half cylindrical surface 119 and the second half cylindrical surface 202 are collinear.

In this way, the support mechanism 200 can be allowed to rotate relative to the first shell 110 about the second reference axis L2, so as to adjust the posture of the to-be-charged device and limit the relative movement of the support mechanism 200 and the first shell 110 along the second reference axis L2, thereby maintaining the stability of supporting the wireless charging module 100 by the support mechanism 200.

A radian of the second half cylindrical surface 202 may match that of the first half cylindrical surface 119, which can improve the fit between the second half cylindrical surface 202 and the first half cylindrical surface 119 and facilitate stable abutment of the elastic member 118 against the ball head 201.

Figure 11:
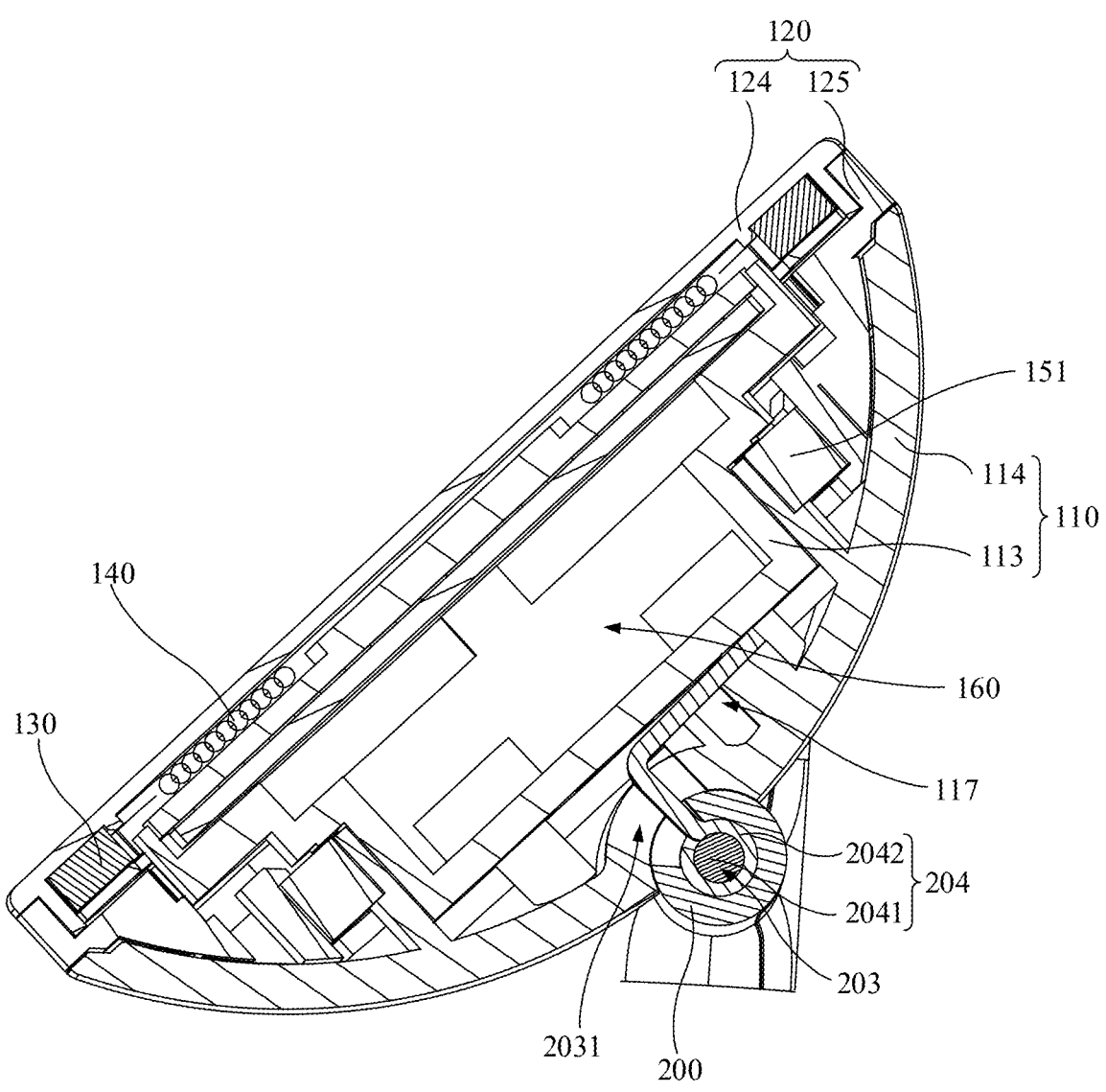
FIG. 11 is a schematic diagram of a partial cross-sectional structure of an example of the wireless charging apparatus in the present application.

As shown in FIG. 1 and FIG. 11, one of the support mechanism 200 and the first shell 110 may be provided with a connecting shaft segment 204, the other of the support mechanism 200 and the first shell 110 may be provided with a connecting hole 203, and the connecting shaft segment 204 may be inserted into the connecting hole 203 and may be in interference fit with the connecting hole 203. Extension directions of the connecting shaft segment 204 and the connecting hole 203 may be parallel to the second reference axis L2. Further, the connecting shaft segment 204 and the connecting hole 203 may be made of metal to improve strength and prolong service life.

In this way, the support mechanism 200 can be allowed to rotate relative to the first shell 110 under force about the second reference axis L2, so as to adjust the posture of the to-be-charged device. The interference fit between the connecting shaft segment 204 and the connecting hole 203 can increase friction to limit the relative movement of the support mechanism 200 and the first shell 110 to some extent, and is conducive to the stability of supporting the wireless charging module 100 by the support mechanism 200.

In some examples, as shown in FIG. 11, the first shell 110 is provided with the connecting shaft segment 204, and the support mechanism 200 is provided with the connecting hole 203. The connecting shaft segment 204 may include a column 2041 and a connecting piece 2042, one end of the connecting piece 2042 surrounds the column 2041 and is located in the connecting hole 203 together with the column 2041, the first shell 110 is provided with a connecting groove 117, a side wall of the connecting hole 203 is provided with an avoidance port 2031 and is in communication with the connecting groove 117 through the avoidance port 2031, and the other end of the connecting piece 2042 movably extends into the connecting groove 117 through the avoidance port 2031 and is fixed in the connecting groove 117. This configuration can allow the connecting shaft segment 204 to rotate within the connecting hole 203, which can facilitate the assembly and connection of the support mechanism 200 with the first shell 110.

In some examples, the connecting shaft segment 204 may not include the column 2041, a portion of the connecting piece 2042 that is located within the connecting hole 203 has an open ring structure, and the wire 230 can pass through the open ring structure of the connecting piece 2042 and enter the connecting groove 117 and then is electrically connected to the wireless charging assembly 140.

In summary, this application can achieve synchronous rotation of the second shell 120 and the to-be-charged device when the user adjusts the posture of the to-be-charged device in the circumferential direction D1 of the first shell 110, so that there is no sliding friction between the second shell 120 and the to-be-charged device, which can improve the smoothness of rotation of the to-be-charged device and improve user's hand feel. For example, the to-be-charged device may be a mobile phone. By rotating the to-be-charged device relative to the first shell 110, the posture of the phone can be adjusted, and the phone can switch between horizontal and vertical screens, or the tilting phone can be straightened.

Described above are only the examples of the present application, and the patent scope of the patent application is not limited thereto. Any equivalent structure or equivalent process transformation made using the description and accompanying drawings of the present application, directly or indirectly applied in other related technical fields, is also included in the scope of patent protection of the present application.

What is claimed is:

1. A wireless charging apparatus, comprising:
a base;
a first shell;
a second shell rotatably connected to the first shell;
a magnet connected to the second shell;
a wireless charging assembly connected to the second shell; and
a support rod on the base and connected to the first shell, wherein:
a charging region corresponding to the wireless charging assembly is formed on a surface of the second shell, and
the second shell comprises a first elastic raised protrusion, the first shell comprises a plurality of buckle grooves that are distributed in a circumferential direction of the first shell, and the plurality of buckle grooves are configured to engage with the first elastic raised protrusion, or
the first shell comprises a second elastic raised protrusion, the second shell comprises a second plurality of buckle grooves that are distributed in a circumferential direction of the second shell, and the second plurality of buckle grooves are configured to engage with the second elastic raised protrusion.

2. The wireless charging apparatus according to claim 1, wherein the second shell is configured to rotate in a circumferential direction of the first shell relative to the first shell.

3. The wireless charging apparatus according to claim 1, further comprising:
an elastic conductive contact and a conductive metal that correspondingly abut against each other, wherein:
the elastic conductive contact is disposed on the second shell and electrically connected to the wireless charging assembly, and the conductive metal is disposed on the first shell and electrically connected to a power source through a wire; or
the conductive metal is disposed on the second shell and electrically connected to the wireless charging assembly, and the elastic conductive contact is disposed on the first shell and electrically connected to the power source through the wire.

4. The wireless charging apparatus according to claim 1, further comprising:

a bearing located between the second shell and the first shell, wherein the second shell is configured to rotate relative to the first shell through the bearing.

5. The wireless charging apparatus according to claim 1, further comprising:

a rolling ball located between the second shell and the first shell, wherein the second shell is configured to rotate relative to the first shell through the rolling ball.

6. The wireless charging apparatus according to claim 1, wherein:

a bearing is provided between the second shell and the first shell;

the first shell comprises an inner shell and an outer shell;

the second shell and the inner shell enclose an accommodating space, and the magnet and the wireless charging assembly are located within the accommodating space;

the outer shell is located on a periphery of the inner shell, and a mounting space is formed between the outer shell and the inner shell; and the bearing is disposed inside the mounting space and sleeved on the periphery of the inner shell, and the second shell extends into the mounting space and abuts against an outer ring of the bearing.

7. The wireless charging apparatus according to claim 2, wherein:

the first shell comprises a stop surface in the circumferential direction of the first shell, and the stop surface is configured to limit the second shell from rotation in a direction.

8. The wireless charging apparatus according to claim 1, wherein:

one of the second shell and the first shell comprises a limit plate, and in a circumferential direction of the first shell, the other of the second shell and the first shell comprises a first limiting surface and a second limiting surface angularly displaced from the first limiting surface; and the limit plate is movably located between the first limiting surface and the second limiting surface to limit a relative rotation of the second shell and the first shell by abutting against the first limiting surface or the second limiting surface.

9. The wireless charging apparatus according to claim 1, wherein:

the second shell is rotatable relative to the first shell about a first reference axis;

the support rod is rotatably connected to the first shell, and the second shell and the first shell are rotatable relative to the support rod about a second reference axis; and an extension direction of the first reference axis intersects with an extension direction of the second reference axis.

10. The wireless charging apparatus according to claim 1, wherein:

the support rod is provided with a ball head, the first shell is provided with a connecting groove, an elastic member is provided inside the connecting groove, and the ball head rotatably extends into the connecting groove and elastically abuts against the elastic member.

11. The wireless charging apparatus according to claim 9, wherein:

one of the support rod and the first shell is provided with a connecting shaft segment, the other of the support rod and the first shell is provided with a connecting hole, the connecting shaft segment is inserted into the connecting hole and is in interference fit with the connecting hole, and extension directions of the connecting shaft segment and the connecting hole are parallel to the second reference axis.

12. The wireless charging apparatus according to claim 1, further comprising:

a circuit board assembly, wherein:

the circuit board assembly comprises a heat dissipation circuit board and a control circuit board, the control circuit board is disposed inside the base, and the wireless charging assembly is disposed on the heat dissipation circuit board and electrically connected to the heat dissipation circuit board.

13. The wireless charging apparatus according to claim 1, wherein:

the support rod comprises a main rod and a branch rod, the main rod is connected to the base, and the branch rod is connected to the main rod; and the branch rod is a retractable structure.

14. The wireless charging apparatus according to claim 1, wherein:

the support rod comprises a main rod and a branch rod, the main rod is connected to the base, and the branch rod is connected between the first shell and the main rod; and the branch rod is rotatably connected to the main rod.

15. The wireless charging apparatus according to claim 1, further comprising a back wireless charging assembly, wherein:

a back charging region corresponding to the back wireless charging assembly is formed on the first shell, and the back wireless charging assembly is connected to the second shell or the first shell to charge an electronic device in the back charging region.

16. The wireless charging apparatus according to claim 1, wherein the magnet is configured to hold an electronic device to the charging region through magnetic force.

17. A wireless charging apparatus, comprising:

a base;

a support rod mounted to the base and extending upwardly from the base;

a branch rod connected to the support rod;

a first wireless charging device configured to charge a first electronic device, wherein the first wireless charging device comprises:

a support and a device mounting surface, the support and the device mounting surface being rotatably coupled to each other, the support being mounted to the support rod;

a first wireless charging assembly; and a magnet; and a second wireless charging device configured to charge a second electronic device, the second wireless charging device being attached to and supported by the branch rod, the branch rod configured to drive the second wireless charging device to rotate around the support rod.

18. The wireless charging apparatus according to claim 17, wherein:

the base comprises an upper surface, and a third wireless charging device configured to charge a third electronic device placed on the upper surface.

19. A wireless charging system, comprising:

a base;

a housing;

a magnet connected to the housing;

a first wireless charging assembly connected to the housing;

a support rod on the base and connected to the housing;

a branch rod connected to the support rod and a second wireless charging assembly, the branch rod configured to drive the second wireless charging assembly to to rotate around the support rod; and a third wireless charging assembly connected to the base, wherein:

the first wireless charging assembly is configured to charge a first electronic device, the second wireless charging assembly is configured to charge a second electronic device, and the third wireless charging assembly is configured to charge a third electronic device.

* * * * *